(12) United States Patent
Dokan et al.

(10) Patent No.: US 9,218,983 B2
(45) Date of Patent: Dec. 22, 2015

(54) ETCHING METHOD AND DEVICE

(75) Inventors: Takashi Dokan, Sendai (JP); Masaru Sasaki, Sendai (JP); Hikaru Kamata, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 7 days.

(21) Appl. No.: 14/131,713

(22) PCT Filed: Jul. 12, 2012

(86) PCT No.: PCT/JP2012/067792
§ 371 (c)(1),
(2), (4) Date: Jun. 4, 2014

(87) PCT Pub. No.: WO2013/008878
PCT Pub. Date: Jan. 17, 2013

(65) Prior Publication Data
US 2014/0308815 A1    Oct. 16, 2014

(30) Foreign Application Priority Data

Jul. 13, 2011  (JP) ................. 2011-155171

(51) Int. Cl.
*H01L 21/302* (2006.01)
*H01L 21/3065* (2006.01)
*H01L 21/02* (2006.01)
(Continued)

(52) U.S. Cl.
CPC ........ *H01L 21/3065* (2013.01); *H01L 21/0206* (2013.01); *H01L 21/0337* (2013.01); *H01L 21/31116* (2013.01); *H01L 21/31144* (2013.01);
(Continued)

(58) Field of Classification Search
USPC .......... 216/46, 67, 79; 134/1.1; 438/696, 721, 438/723, 724
See application file for complete search history.

(56) References Cited

U.S. PATENT DOCUMENTS

| 5,356,478 | A  | * | 10/1994 | Chen et al. ................. 134/1 |
| 8,812,150 | B2 | * | 8/2014 | van der Meulen et al. ... 700/228 |
| 2005/0269294 | A1 | * | 12/2005 | Igarashi et al. ............ 216/67 |
| 2009/0291563 | A1 | * | 11/2009 | Ishibashi .................. 438/710 |

FOREIGN PATENT DOCUMENTS

| CN | 1707761 A | 12/2005 |
| JP | 5-291213 A | 11/1993 |

(Continued)

OTHER PUBLICATIONS

International Search Report mailed Aug. 28, 2012 in PCT/JP2012/067792.

*Primary Examiner* — Binh X Tran
*Assistant Examiner* — Maki Angadi
(74) *Attorney, Agent, or Firm* — Rothwell, Figg, Ernst & Manbeck, P.C.

(57) ABSTRACT

The etching method of the present invention comprises first and second etching steps (S1, S3) having different types of films to be etched and different types of process gases. During a transition from the first etching step (S1) to the second etching step (S3), a first switching process step (S2) is performed in which the process container is filled with a cleaning gas and the cleaning gas is turned into a plasma to remove the reaction product deposited in the process container in the first etching step. During a transition from the second etching step (S3) to the first etching step (S1), a second switching process step (S4) is performed in which the process container is filled with a cleaning gas and the cleaning gas is turned into a plasma to remove the reaction product deposited in the process container in the second etching step.

11 Claims, 10 Drawing Sheets

(51) Int. Cl.
    H01L 21/311    (2006.01)
    H01L 21/3213   (2006.01)
    H01L 21/67     (2006.01)
    H01L 21/033    (2006.01)

(52) U.S. Cl.
    CPC .... *H01L 21/32137* (2013.01); *H01L 21/67069* (2013.01); *H01J 2237/334* (2013.01)

(56) References Cited

FOREIGN PATENT DOCUMENTS

| | | |
|---|---|---|
| JP | 7-78802 A | 3/1995 |
| JP | 10-280151 A | 10/1998 |
| JP | 2000-3905 A | 1/2000 |
| JP | 2005-353698 A | 12/2005 |
| JP | 2009-278039 A | 11/2009 |
| JP | 2010-93293 A | 4/2010 |
| TW | 201034072 A | 9/2010 |

* cited by examiner

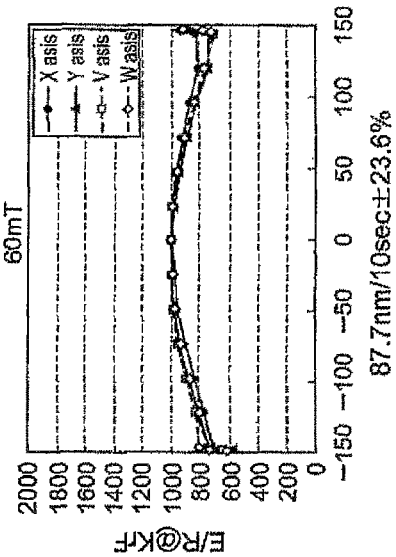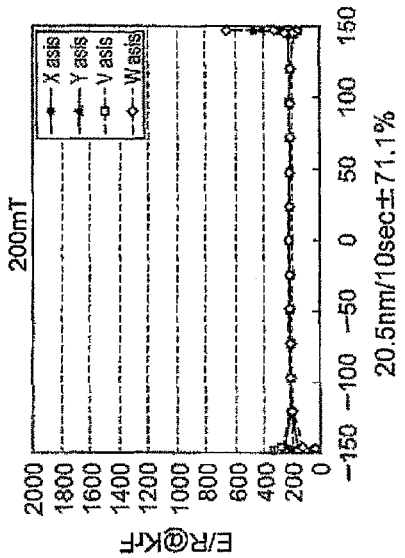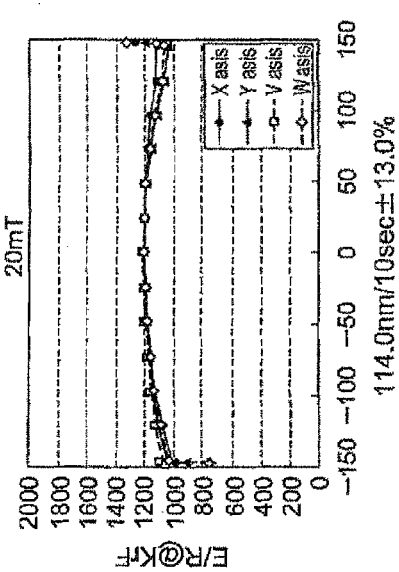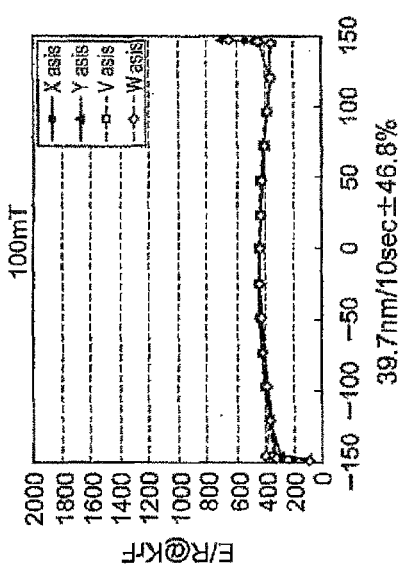

US 9,218,983 B2

ETCHING METHOD AND DEVICE

CROSS REFERENCE TO RELATED APPLICATION

This application is a 35 U.S.C. 371 National Phase Entry Application from PCT/JP2012/067792, filed Jul. 12, 2012, which claims the benefit of Japanese Patent Application No. 2011-155171, filed Jul. 13, 2011, the disclosures of which are incorporated herein in their entirety by reference.

TECHNICAL FIELD

The present disclosure relates to an etching method and an etching device, in which a processing gas introduced into a processing container is turned into plasma so as to perform etching on a substrate.

BACKGROUND

In a manufacturing process of, for example, a semiconductor wafer or an FPD substrate, an etching process is performed in which a processing gas is introduced into a processing container and is turned into plasma to perform dry etching of a substrate. In the etching process, it is necessary to vary the types of the processing gas according to the types of a film to be etched.

For example, when a polysilicon film on a substrate is etched, a halogen-based processing gas which contains a halogen element such as, for example, HBr or $Cl_2$, is introduced into a processing container. Meanwhile, when an insulating film layered on the substrate, for example, a silicon oxide film, is etched, a CF-based processing gas which contains carbon and fluorine is introduced into the processing container.

Conventionally, etching processes using different types of processing gases have been performed in separate processing containers, independently. That is, a processing container employing a halogen-based gas and a processing container employing a CF-based gas have been dedicated to and performed etching processings on different films, respectively. In order to stabilize an etching rate of a substrate, each time when one sheet of substrate is etched, a dry-cleaning has been performed to remove deposits adhered on the surface of the processing container (See, e.g., Patent Document 1, and Patent Document 2).

PRIOR ART DOCUMENT

Patent Document

Patent Document 1: Japanese Patent Laid-Open Publication H7-78802
Patent Document 2: Japanese Patent Laid-Open Publication H5-291213

DISCLOSURE OF THE INVENTION

Problems to be Solved

When one processing container may be switched from a processing container employing the halogen-based gas to a processing container employing the CF-based gas, or vice versa, the number of processing containers may be reduced. When etching processings are performed by switching the processing container, the number of substrates which await the processings may be reduced, thereby speeding up the entire etching process.

However, conventionally, according to a general knowledge, etching processes on different gas species and different types of films have been performed in separate processing containers, respectively. This is because, when a process of etching a polysilicon film is switched to a process of etching an insulating film in one processing container, there may be a problem in that an etching rate of a substrate is not stabilized, or particles may occur on the substrate due to deposits (reaction products of etching) adhered on the surface of the processing container. This is the same in the case where a process of etching an insulating film is switched to a process of etching a polysilicon film. In the process of etching the polysilicon film, and the process of etching the insulating film, different kinds of deposits (reaction products of etching) are adhered on the surface of the processing container. Accordingly, the particles may have an influence on the processing of the substrate, thereby inhibiting intended etching. When deposits of the previous etching process remain on the surface or in the gap of the processing container, an etching rate in the following etching process is not stabilized.

Accordingly, an object of the present disclosure is to provide an etching method and an etching device, in which a plurality of etching processes employing different types of films and gases may be switched within the same processing container.

Means to Solve the Problems

In order to solve the problems, an aspect of the present disclosure provides an etching method including: a first etching process of etching a film on a first substrate by introducing a first processing gas into a processing container, and turning the first processing gas into plasma; and a second etching process of etching a film, of which the type is different from that of the film on the first substrate, on a second substrate by introducing a second processing gas, of which the type is different from that of the first processing gas, into the processing container, and turning the second processing gas into plasma. The first etching process and the second etching process are performed within the same processing container in a switching manner. During transition from the first etching process to the second etching process, a first switching process is performed to introduce a cleaning gas into the processing container and turn the cleaning gas into plasma so as to remove reaction products deposited within the processing container in the first etching process, and/or during transition from the second etching process to the first etching process, a second switching process is performed to introduce a cleaning gas into the processing container and turn the cleaning gas into plasma so as to remove reaction products deposited within the processing container in the second etching process.

Another aspect of the present disclosure provides an etching method including: a first etching process of etching a film on a substrate by introducing a first processing gas into a processing container and turning the first processing gas into plasma; and a second etching process of etching a film, of which the type is different from that of the film on the substrate, by introducing a second processing gas, of which the type is from that of the first processing gas, into the processing container and turning the second processing gas into plasma. The first etching process and the second etching process are performed within the same processing container in a switching manner. During transition from the first etching process to the second etching process, a first switching process is performed to introduce a cleaning gas into the processing container and turn the cleaning gas into plasma so as to remove reaction products deposited within the processing container in the first etching process, and/or during transition from the second etching process to the first etching process, a second switching process is performed to introduce a cleaning gas into the processing container and turn the cleaning gas into plasma so as to remove reaction products deposited within the processing container in the second etching process.

A further aspect of the present disclosure provides an etching device including a control unit. The control unit causes a first etching and a second etching to be performed within a same processing container in a switching manner to introduce a first processing gas into the processing container and turn the first processing gas into plasma so as to etch a film on a substrate in the first etching, and to introduce a second processing gas, of which the type is different from that of the first processing gas, into the processing container and turn the second processing gas into plasma so as to etch a film, of which the type is different from that of the film on the substrate in the second etching. During transition from the first etching to the second etching, a cleaning gas is introduced into the processing container and turned into plasma so as to remove reaction products deposited within the processing container in the first etching. During transition from the second etching to the first etching, a cleaning gas is introduced into the processing container and turned into plasma so as to remove reaction products deposited within the processing container in the second etching.

Effect of the Invention

According to the present disclosure, a plurality of etching processings may be performed in the same processing container. A cleaning gas is introduced into a processing container, and is turned into plasma to remove reaction products deposited within the processing container. Thus, the etching rate and the amount of generated particles after switching may be the same as those in processings performed after switching the processing container.

BRIEF DESCRIPTION OF THE DRAWINGS

FIGS. 9A to 9D illustrate graphs of test results on an etching rate of a KrF photoresist under different pressures.

DETAILED DESCRIPTION TO EXECUTE THE INVENTION

Figure 1:
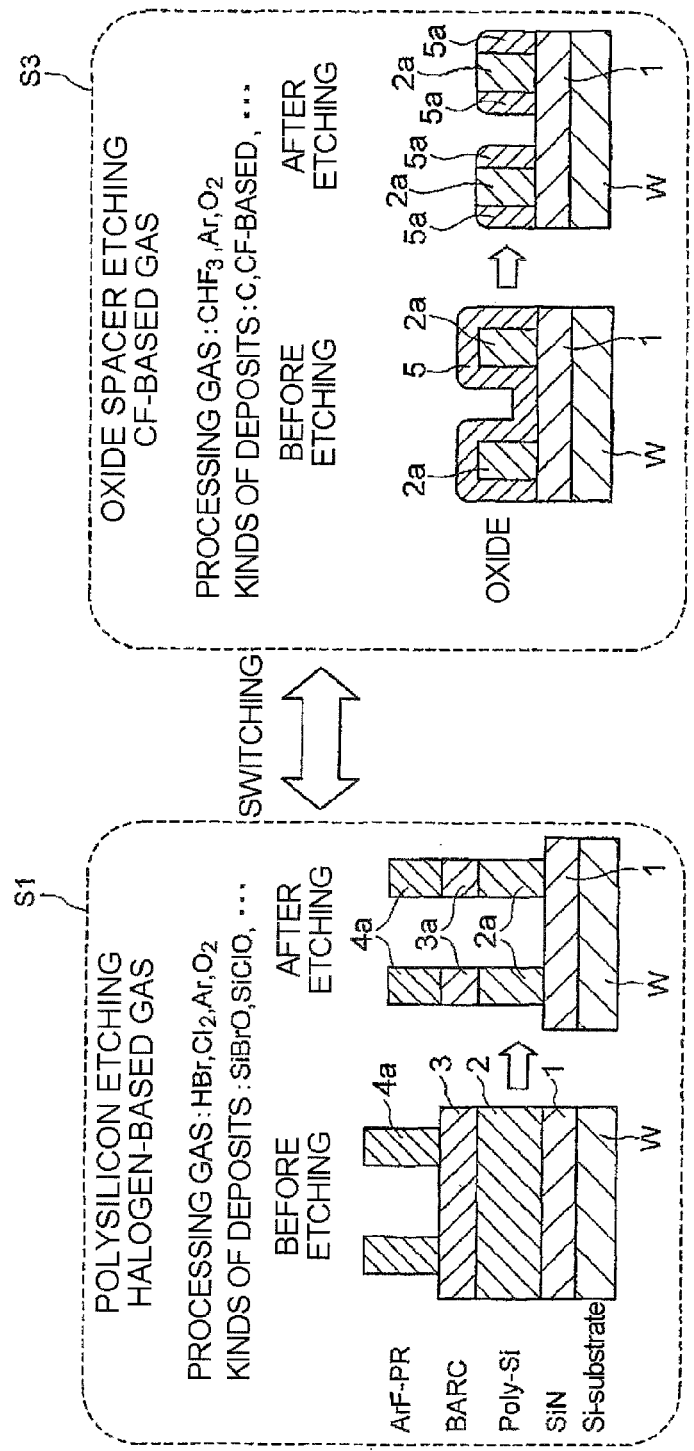
FIG. 1 is a conceptual view of an etching method according to an exemplary embodiment of the present disclosure.

Hereinafter, an etching method according to an exemplary embodiment of the present disclosure will be described with reference to accompanying drawings. FIG. 1 illustrates a conceptual view of switching between a first etching process S1 and a second etching process S3. At the left side of FIG. 1, the first etching process S1 is illustrated, and at the right side of FIG. 1, the second etching process S3 is illustrated.

In the first etching process S1, a halogen-based gas is used as a first processing gas to etch a silicon-containing film, for example, a polysilicon film. At the right side of FIG. 1, a process of etching an insulating film by using a CF-based gas as a second processing gas is illustrated. The insulating film is, for example, a silicon oxide film or a silicon nitride film. In this exemplary embodiment to be described, a silicon oxide film is etched.

The etching of a polysilicon film 2 at the left side of FIG. 1 is performed to form a gate electrode 2a on a wafer W as a substrate. On the wafer W made of, for example, silicon, a silicon nitride film 1, the polysilicon film 2 and an anti-reflection layer 3 (BARC) are sequentially formed. The silicon nitride film 1 and the polysilicon film 2 are formed by, for example, a chemical vapor deposition (CVD). On the surface of the anti-reflection layer 3, an ArF photoresist is coated. On the photoresist layer, a mask pattern is transferred through exposure. The exposed photoresist layer is developed. On the surface of the developed anti-reflection layer 3, a resist pattern 4a is formed.

The wafer formed with the resist pattern 4a is carried into an RLSA etching device as an etching device. A detailed structure of the RLSA etching device will be described later. In the RLSA etching device, the polysilicon film 2 is etched by using the resist pattern 4a as a mask. By the etching, the gate electrode 2a corresponding to the resist pattern 4a is formed.

A mixed gas of a plasma excitation gas and an etching gas is introduced into a processing container of the RLSA etching device as a first processing gas. An inert gas, e.g., at least one of Ar, He, Ne, Kr and Xe, is used as the plasma excitation gas. A gas containing a halogen element, e.g., HBr or $Cl_2$, is used as the etching gas. In order to control the shape of the object to be etched, a gas containing oxygen, e.g., $O_2$ or CO gas, is added.

Table 1 represents an example of a processing condition for etching a polysilicon film.

TABLE 1

| | Processing Gas |
|---|---|
| First Step | Ar: 400 sccm |
| | $Cl_2$: 100 sccm |
| Second Step | Ar: 400 sccm |
| | HBr: sccm |
| Pressure | 20 mT |
| Microwave Power | 2000 W |
| RF bias | 100 W |
| Substrate Temperature | 30° C. |
| Processing Time | 60 sec |

The first processing gas is introduced into the processing container, and the processing container is decompressed to a predetermined pressure. Then, a microwave is introduced into the processing container by using an RLSA to turn the first processing gas within the processing container into plasma. The polysilicon film 2 is etched by the plasma of the first processing gas. When the polysilicon film 2 is etched, reaction products of the etching gas with the polysilicon film, for example, SiBrO, and SiClO are deposited on an inner wall surface of the processing container.

The etching of a silicon oxide film 5 at the right side of FIG. 1 is performed to form a spacer 5a on the side wall of the gate electrode 2a. On the surface of the wafer W, and the surface of the gate electrode 2a, the silicon oxide ($SiO_2$) film 5 is formed by a chemical vapor deposition (CVD) method.

The wafer W formed with the silicon oxide film 5 is conveyed into an RLSA (registered mark) etching device. In the RLSA etching device, the spacer 5a is formed on the side wall of the gate electrode 2a through etchback of the silicon oxide film 5 layered on the surface of the wafer W and the surface of the gate electrode 2a.

A mixed gas of a plasma excitation gas and an etching gas is introduced into a processing container of the RLSA etching device as a second processing gas. An inert gas, e.g., at least one of Ar, He, Ne, Kr and Xe, is used as the plasma excitation gas. A mixed gas of at least one selected from the group consisting of $CH_2F_2$, $CHF_3$, and $CH_3F$ and at least one selected from the group consisting of $O_2$, CO, CN, and $N_2$ is used as the etching gas. In this example, a mixed gas of Ar, $CHF_3$, and $O_2$ is used for etching the silicon oxide film 5. Table 2 illustrates an example of a processing condition for etching the silicon oxide film 5.

TABLE 2

|  | processing gas<br>Ar: 450 sccm<br>$CHF_3$: 50 sccm<br>$O_2$: 2 sccm |
| --- | --- |
| Pressure | 20 mT |
| Microwave Power | 2000 W |
| RF Bias | 100 W |
| Substrate Temperature | 30° C. |
| Processing Time | 60 sec |

The second processing gas is introduced into the processing container, and the processing container is decompressed to a predetermined pressure. Then, a microwave is introduced into the processing container by using a slot antenna so as to turn the second processing gas within the processing container into plasma. The silicon oxide film 5 is etched by the plasma of the second processing gas. When etching the silicon oxide film 5, a processing of increasing an etching selection ratio of the silicon oxide film with respect to the silicon nitride film 1 or the polysilicon film 2 is required. Accordingly, the etching is performed while depositing deposits (C, CFx) so as to suppress the silicon nitride film 1 or the polysilicon film 2 from being etched. The deposits derived from a CF-based gas are deposited on the surface of the wafer W or the processing container.

Figure 2:
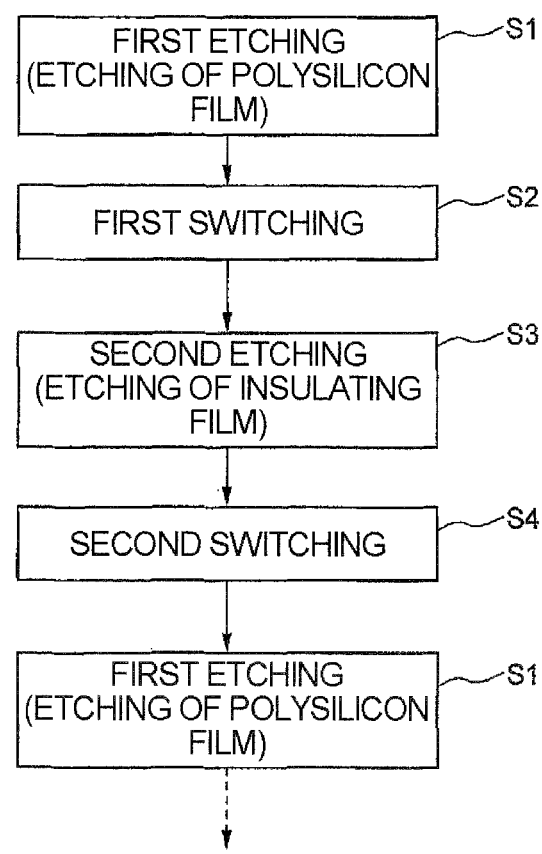
FIG. 2 is a flow chart of an etching method according to a first exemplary embodiment of the present disclosure.

FIG. 2 illustrates a flow chart of the etching method according to the exemplary embodiment of the present disclosure. As illustrated in FIG. 2, when the first etching process S1 is switched to the second etching process S3, a first switching process S2 is performed. The first switching process S2 is also performed within the RLSA etching device.

In the first switching process S2, a gas containing fluorine is introduced into the processing container, as a cleaning gas. In the exemplary embodiment, a mixed gas of $SF_6$, $O_2$ and Ar is used as the cleaning gas. Ar is used as a plasma excitation gas. Within the processing container, the cleaning gas is turned into plasma so as to remove the reaction products deposited within the processing container in the first etching process, such as SiBrO, and SiClO. $SF_6$ is used to remove Si in the reaction products, such as, for example, SiBrO, and SiClO by converting Si into SiF. $O_2$ is used to remove carbon in a resist film by converting carbon into, for example, CO. Besides $SF_6$, either a CF-based gas such as, for example, $CF_4$ or $CF_4O_2$, or $NF_3$ may be used. Besides Ar, an inert gas, for example, He, Ne, Kr or Xe, may be used. The first switching process may be performed in a waferless state where a wafer W is not placed on a mounting table of the processing container.

The first switching process S2 is performed in two stages of a low pressure processing and a high pressure processing. The low pressure is 10 mT (Torr) or more and less than 100 mT. The high pressure is 100 mT or more and less than 300 mT. Table 3 represents an example of a processing condition for the first switching process.

TABLE 3

| Cleaning Gas | $SF_6/O_2$/Ar |
| --- | --- |
| Pressure and Time of Low Pressure Processing Step | 20 mT, 5 min |
| Pressure and Time of High Pressure Processing Step | 150 mT, 5 min |

When the pressure within the processing container is set to the low pressure, plasma is diffused within the processing container as a whole. Thus, the whole of the processing container including the lower portion may be cleaned. When the inside of the processing container is set to the high pressure, a plasma density at the upper portion of the processing container becomes relatively high. Thus, the dielectric window and the upper side wall of the processing container may be effectively cleaned. When the process is performed in two stages of the low pressure processing step and the high pressure processing step, the whole of the processing container may be cleaned within a short time.

While the second etching process S3 is switched to the first etching process S1, a second switching process S4 is performed. The second switching process S4 is also performed within the RLSA etching device.

In the second switching process S4, a gas containing $O_2$ is introduced into the processing container as a cleaning gas. In the exemplary embodiment, $O_2$ is used as the cleaning gas, and Ar is used as the plasma excitation gas. $N_2$ may be added to $O_2$ as in an ashing process. The cleaning gas is turned into plasma and removes the reaction products deposited within the processing container in the second etching process, such as C and CF. $O_2$ is used to remove C in the reaction products such as C and CF by converting C into, for example, CO. The second switching process S4 may be performed in a waferless state where a wafer W is not placed on the mounting table of the processing container.

The second switching process S4 may be performed in two stages of a high pressure processing and a low pressure processing. Table 4 represents an example of a processing condition for the second switching process.

TABLE 4

| Cleaning Gas | $O_2$/Ar |
| --- | --- |
| Pressure and Time of High Pressure Processing Step | 300 mT, 5 min |
| Pressure and Time of Low Pressure Processing Step | 20 mT, 5 min |

Unlike the first switching process S2, the second switching process S4 performs a high pressure processing step first, and a low pressure processing step second. In the high pressure processing step, the concentration of plasma at the upper portion of the processing container becomes relatively high. Thus, the dielectric window and the upper side wall of the processing container may be effectively cleaned. In the low pressure processing step, plasma is diffused within the processing container as a whole. Thus, the whole of the processing container including the lower portion may be cleaned. When the process is performed in two steps of the high pressure processing step and the low pressure processing step, the whole of the processing container may be cleaned within a short time.

An RLSA etching device is used in the above-described first and second etching processes S1 and S3, and the above-described first and second switching processes S2 and S4. However, other etching devices configured to generate plasma may be used. The configuration of the RLSA etching device will be described below.

Figure 3:
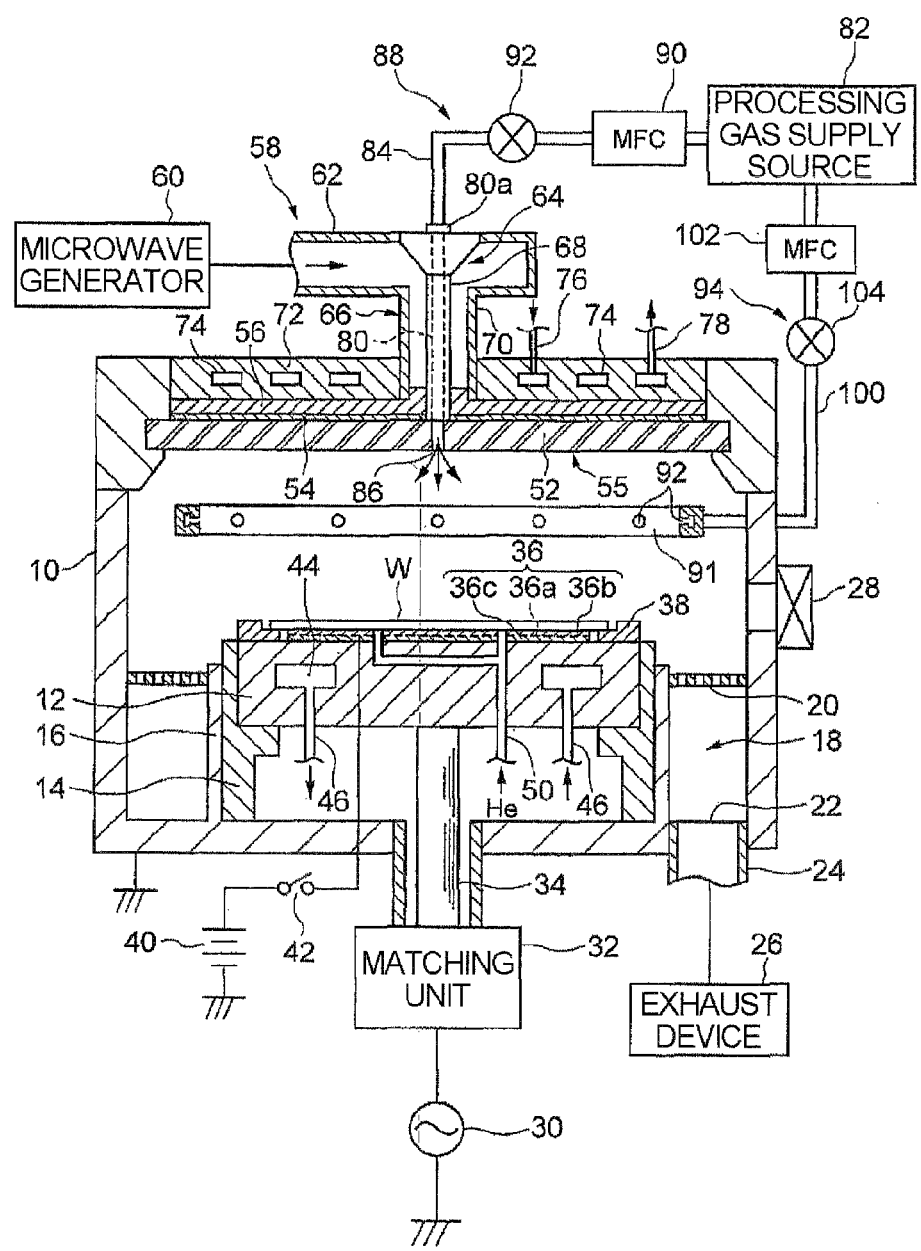
FIG. 3 is a schematic cross-sectional view of an RLSA etching device.

FIG. 3 illustrates a schematic cross-sectional view of an RLSA etching device. The RLSA etching device uses a microwave as a plasma source. When microwave-excited plasma is used, plasma with a low electron temperature and a high density may be generated in a region where etching is performed.

The RLSA etching device includes a cylindrical processing container 10 made of, for example, aluminum or a stainless steel. The processing container 10 is grounded.

First, descriptions will be made on constitutional elements or members which directly do not contribute to the generation of microwave excited-plasma in the processing container 10 of the RLSA etching device.

A mounting table 12 on which a wafer W is placed is provided at the center of the bottom portion of the processing container 10. The mounting table 12 is held by a cylindrical support unit 14 which extends upwardly from the bottom portion of the processing container 10. The mounting table 12 is made of an insulating material such as, for example, alumina or aluminum nitride, and is formed in a disk shape. The mounting table 12 is provided with a lower electrode therein in which the lower electrode is applied with high frequency waves.

An annular exhaust path 18 is formed between an inside surface of the processing container 10 and a cylindrical wall 16. The cylindrical wall 16 surrounds the cylindrical support unit 14 and extends upwardly from the bottom portion of the processing container 10. An annular baffle plate 20 is disposed at the top of the exhaust path 18, and an exhaust port 22 is formed at the bottom of the exhaust path 18. A plurality of exhaust ports 22 are formed in the annular exhaust path 18 in the circumferential direction at regular angle intervals in order to achieve a uniform gas flow symmetrically distributed with respect to a wafer W on the mounting table 12. Each exhaust port 22 is connected to an exhaust device 26 through an exhaust pipe 24. The exhaust device 26 is provided with a vacuum pump such as, for example, a turbo molecular vacuum pump (TMP), which evacuates the inside of the processing container 10 so that the inside may be decompressed to a predetermined pressure. A gate valve 28 opens and closes a conveyance port through which the wafer W is carried into or out of the processing container.

The mounting table 12 is electrically connected to a high frequency power source 30 configured to apply an RF bias voltage to the mounting table 12 through a matching unit 32 and a power feeding rod 34. The high frequency power source 30 outputs high frequency waves of a relatively low frequency, for example, 13.56 MHz, at a predetermined power level. Such a low frequency is suitable for controlling energy of ions to be attracted to the wafer W on the mounting table 12. The matching unit 32 has a blocking condenser configured to generate self-bias.

An electrostatic chuck 36 is provided on the top surface of the mounting table 12. The electrostatic chuck 36 holds the wafer W on the mounting table 12 by an electrostatic force. The electrostatic chuck 36 includes an electrode 36a formed of a conductive film, and a pair of insulating films 36b and 36c on the top and bottom of the electrode 36a with the electrode 36a being interposed therebetween. A DC power source 40 is electrically connected to the electrode 36a through a switch 42. A DC voltage applied from the DC power source 40 to the electrostatic chuck 36 generates a Coulomb force for holding the wafer W on the electrostatic chuck 36. A focus ring 38 is provided at the outer circumference of the electrostatic chuck 36 to surround the wafer W.

A coolant path 44 is provided within the mounting table 12. The coolant path 44 is formed annularly to extend in the circumferential direction. A cooling medium or cooling water of a predetermined temperature is supplied from a chiller unit (not illustrated) to the coolant path 44 through a conduit 46 to be circulated in the conduit 46 and the coolant path 44. The temperature of the wafer W on the electrostatic chuck 36 may be adjusted by adjusting the temperature of the cooling medium. A heat transfer gas such as, for example, He gas, is supplied to a gap between the wafer W and the electrostatic chuck from a gas supply unit (not illustrated) through a supply pipe 50.

Hereinafter, descriptions will be made on elements or members which contribute to the generation of microwave plasma within a processing container 10 of the RLSA etching device.

A planar antenna 55 includes a disk shaped dielectric window 52 made of a dielectric substance such as, for example, quartz, ceramic, alumina ($Al_2O_3$) or aluminum nitride (AlN), and a disk shaped slot antenna plate 54. The dielectric window 52 is attached to the processing container 10 to seal the inside of the processing container 10, and serves as a ceiling portion of the processing container 10 which faces the mounting table 12. The slot antenna plate 54 is disposed on the top surface of the dielectric window 52, and has a plurality of slots distributed concentrically. The slot antenna plate 54 is electromagnetically connected to a microwave transmission line 58 through a dielectric plate 56 made of a dielectric substance such as, for example, quartz, ceramic, alumina ($Al_2O_3$) or aluminum nitride (AlN). The dielectric plate 56 reduces the wavelength of microwaves which propagate within the dielectric plate 56.

The microwave transmission line 58 includes a waveguide 62, a waveguide/coaxial tube converter 64, and a coaxial tube 66, and transmits microwaves output from a microwave generator 60 to the slot antenna plate 54. The waveguide 62 is formed of, for example, a rectangular pipe, and transmits TE mode microwaves from the microwave generator 60 to the converter 64.

The converter 64 connects the waveguide 62 to the coaxial tube 66, and converts the TE mode microwaves which propagate within the waveguide 62 to TEM mode microwaves which propagate within the coaxial tube 66. The converter 64 is formed in a conical shape pointed downward, and has an upper end coupled with the waveguide 62, and a lower end coupled with an inner conductor 68 of the coaxial tube 66.

The coaxial tube 66 extends vertically downward from the converter 64 toward the center of the upper portion of the processing container 10 to be connected to the slot antenna plate 54. The coaxial tube 66 includes an outer conductor 70 and the inner conductor 68. The outer conductor 70 has an upper end coupled with the waveguide 62, and a lower end which extends vertically downward and is coupled with the dielectric plate 56. The inner conductor 68 has an upper end connected to the converter 64, and a lower end which extends vertically downward to reach the slot antenna plate 54. The microwaves propagate in the TEM mode between the outer conductor 70 and the inner conductor 68.

The microwaves output from the microwave generator 60 are transmitted to the microwave transmission line 58 which includes the waveguide 62, the converter 64, and the coaxial tube 66, and supplied to the slot antenna plate 54 through the dielectric plate 56. The microwaves are diffused in a radial direction from the dielectric plate 56 and radiated into the processing container 10 through slots of the slot antenna plate 54. Accordingly, a gas just below the dielectric window 52 is excited and plasma is generated within the processing container 10.

An antenna back plate 72 is provided on the top surface of the dielectric plate 56. The antenna back plate 72 is made of, for example, aluminum. A flow path 74 connected to a chiller unit (not illustrated) is formed in the antenna back plate 72. A cooling medium or cooling water of a predetermined temperature is circulated within the flow path 74 and pipes 76 and 78. The antenna back plate 72 serves as a cooling jacket which absorbs heat generated in, for example, the dielectric plate 56, and conducts the heat to the outside.

In the present exemplary embodiment, a gas introduction path 80 is provided to penetrate the inner conductor 68 of the coaxial tube 66. A first gas introduction pipe 84 has one end connected to an upper opening 80*a* of the gas introduction path 80, and the other end connected to a processing gas supply source 82. A gas injection port 86 opened toward the processing container 10 is formed at the center of the dielectric window 52. In a first gas introduction unit 88 provided with the above described configuration, a processing gas from the processing gas supply source 82 flows in the first gas introduction pipe 84 and the gas introduction path 80 within the inner conductor 68 to be ejected from the gas injection port 86 toward the mounting table 12 located at the lower side. The processing gas is drawn by the exhaust device 26 into the annular exhaust path 18 which surrounds the mounting table 12. A flow controller 90 (MFC) and an ON/OFF valve 92 are provided in the middle of the first gas introduction pipe 84.

In the present exemplary embodiment, besides the first gas introduction unit 88, a second gas introduction unit 94 configured to supply a processing gas to the processing container 10 is provided. The second gas introduction unit 94 includes a gas ring 91 disposed within the processing container 10, and a gas supply tube 100 connected to the gas ring 91. The gas ring 91 is formed in a hollow ring shape, and has a plurality of side injection ports 92 formed on the inner circumferential side thereof in the circumferential direction at regular angle intervals. The plurality of side injection ports 92 are opened within a plasma region of the processing container 10. The gas supply tube 100 is connected to the gas ring 91 and the processing gas supply source 82. The flow controller 102 (MFC) and the ON/OFF valve 104 are provided in the middle of the gas supply tube 100.

In the second gas introduction unit 94, a processing gas from the processing gas supply source 82 is introduced to the gas ring 91 through the gas supply tube 100. The internal pressure of the gas ring 91 filled with the processing gas becomes uniform in the circumferential direction so that the processing gas is ejected from the plurality of side injection ports 92 to the plasma region uniformly within the processing container 10 in the horizontal direction.

Figure 4:
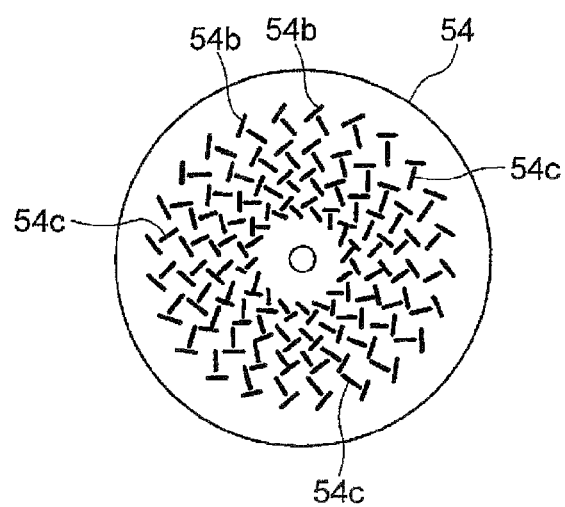
FIG. 4 is a plan view illustrating an example of a slot pattern of a slot antenna plate.

FIG. 4 illustrates an example of a slot pattern of the slot antenna plate 54. The slot antenna plate 54 includes a plurality of slots 54*b* and 54*c* concentrically arranged. Specifically, two kinds of slots of which longitudinal directions are perpendicular to each other are arranged concentrically alternately. The radial interval of concentric circles is determined based on the wavelength of microwaves which propagate in the slot antenna plate 54 in the radial direction. According to this slot pattern, the microwaves are converted into plane waves having two perpendicular polarization components, and the plane waves are radiated from the slot antenna plate 54. The slot antenna plate 54 configured as described above is effective in uniformly radiating the microwaves from the whole area of the antenna into the processing container 10, and is appropriate for generating uniform and stabilized plasma under the antenna. The slot antenna plate 54 configured as described above is called a Radial Line Slot Antenna (RLSA). An etching device provided with the RLSA is called an RLSA etching device.

The individual operations and the whole operation of, for example, the exhaust device 26, the high frequency power source 30, the DC power source 40, the switch 42, the microwave generator 60, the processing gas supply source 82, the chiller unit (not illustrated), and the heat transfer gas supply unit (not illustrated) are controlled by a control unit (not illustrated). The control unit is constituted by, for example, a micro computer.

The control unit switches a first etching process S1 and a second etching process S3 to each other according to the flow chart illustrated in FIG. 2 when receiving a switching signal from a general control device to be described later. The general control device stores a processing procedure for a wafer W. According to the processing procedure, the general control device uses the RLSA etching device as a polysilicon film etching device, or as a silicon oxide film etching device.

A switching function may be incorporated in the control unit of the RLSA etching device so that when one of a plurality of process modules is broken, the RLSA etching device may be used in place of the broken process module.

Figure 5:
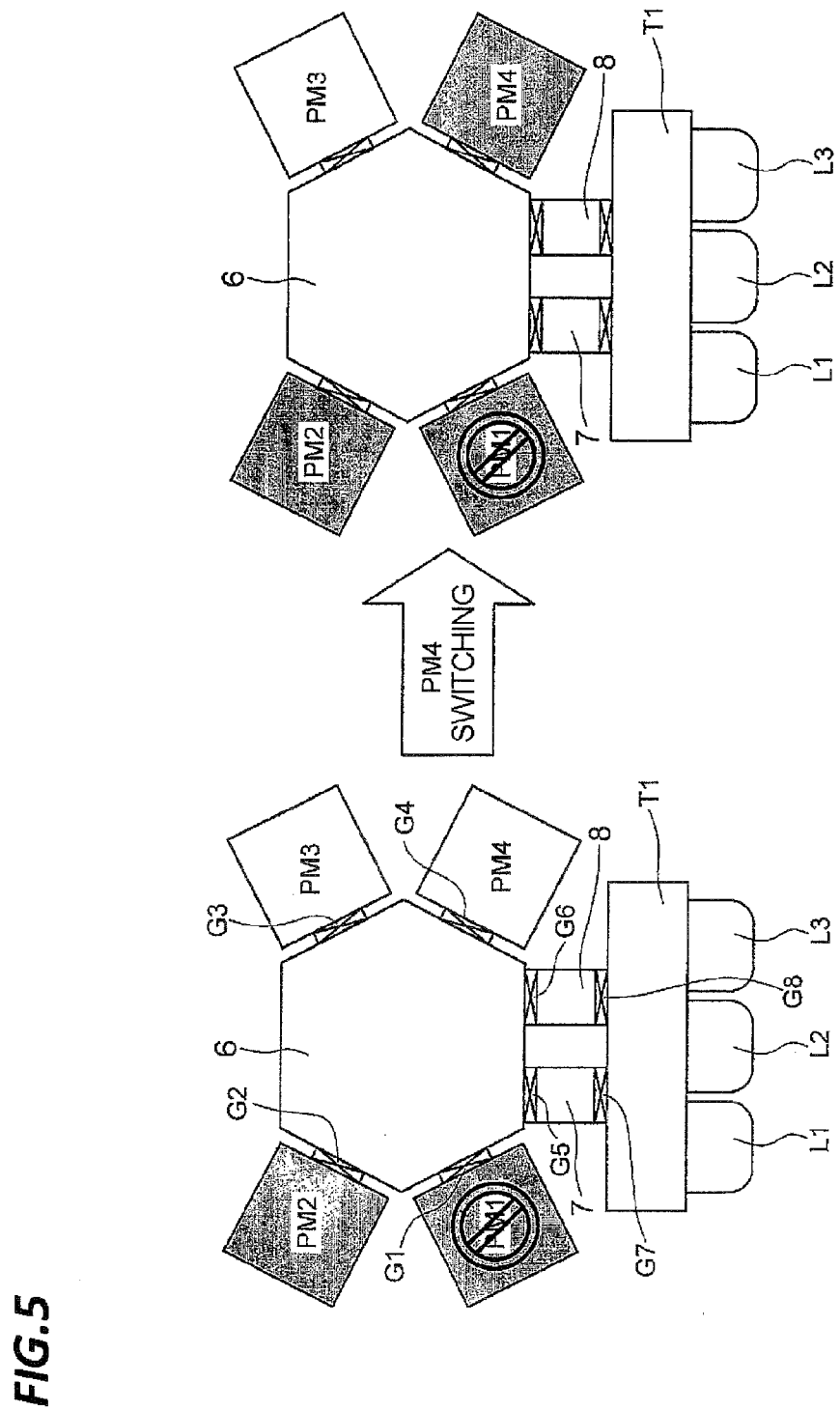
FIG. 5 is a schematic view of a semiconductor manufacturing system equipped with four RLSA etching devices.

FIG. 5 illustrates a schematic view of a semiconductor manufacturing system equipped with four RLSA etching devices as process modules. In the drawing, PM1 and PM2 are polysilicon film etching process modules, and PM3 and PM4 are silicon oxide film etching process modules. These process modules are radially connected to a vacuum conveyance module 6 disposed at the center. Load-lock modules 7 and 8 are connected to the vacuum conveyance module 6.

An atmospheric conveyance module T1 is connected to the load-lock modules 7 and 8. The atmospheric conveyance module T1 is provided with load ports L1, L2, and L3 in each of which a cassette accommodating a plurality of sheets (e.g., 25 sheets) of wafers W is disposed. In the vacuum conveyance module 6, a conveyance robot is accommodated so as to convey wafers W between the load-lock modules 7 and 8 and the process modules PM1 to PM4. Gate valves G1 to G6 are disposed between the process modules PM1 to PM4 and the load-lock modules 7 and 8, and the vacuum conveyance module 6 to be opened and closed according to the conveyance of the wafers W. In the atmospheric conveyance module T1, a robot for conveyance is accommodated so as to convey the wafers W between the load-lock modules 7 and 8 and the load ports L1, L2, and L3. Gate valves G7 and G8 are disposed between the atmospheric conveyance module T1 and the load-lock modules 7 and 8 to be opened and closed according to the conveyance of the wafers W.

Operations of the process modules PM1 to PM4, the load-lock modules 7 and 8, the vacuum conveyance module 6 and the atmospheric conveyance module T1 are controlled by respective control units attached to the modules. The control units are connected to the general control device through a network such as, for example, LAN. The controls of the respective modules by the respective control units are controlled totally by the general control device. The general control device controls these modules according to a predetermined processing procedure. For example, when performing polysilicon film etching, the wafers W accommodated in the load port L1 are conveyed to the polysilicon film etching process modules PM1 and PM2, and the wafers W which have been processed in the process modules PM1 and PM2 are carried out to the load port L1. When performing silicon oxide film etching, wafers W accommodated in the load port L2 are conveyed to the silicon oxide film etching process modules PM3 and PM4, and the wafers W which have been processed in the process modules PM3 and PM4 are carried out to the load port L2.

For example, when the polysilicon film etching process module PM1 is broken, a processing on the wafers W for polysilicon film etching is delayed. Here, by switching the silicon oxide film etching process module PM4 to a polysilicon film etching process module, the processing on the wafers W for polysilicon film etching may be performed. Accordingly, it is possible to reduce the staying time of the cassette accommodating the wafers W for polysilicon film etching.

For example, a switching signal is generated by the general control device as described below. A monitor of the general control device displays that PM1 is a polysilicon film etching process module. A touch panel-type switch is present on the monitor. When an operator presses down the switch on the monitor, the general control device detects that the switch is pressed down, and transmits the switching signal to the process module PM4. At the same time, the general control device updates the stored processing procedure, and conveys the wafers W to be processed in PM1 to PM4. When the switching of the process module PM4 is completed, the monitor of the general control device displays that the switching has been completed. Instead of the switch operation by the operator, when the general control device detects failure of PM1, a switching signal may be automatically transmitted to PM4.

Example 1

Switching from Silicon Oxide Film to Polysilicon Film

As described below, spacer etching of a silicon oxide film was switched to etching of a polysilicon film. Then, after the switching, the etching rate of the polysilicon films and the amount of generated particles were measured.

First, spacer etching of silicon oxide films was performed under the conditions represented in Table 2 while the flow rate of a processing gas was set as $Ar/CHF_3/O_2=450/50/2$ sccm. Here, cleaning was performed each time when one wafer was etched according to the cleaning recipe so as not to change the etching rate. The cleaning was $O_2$ dry-cleaning, and was performed in a state where no wafer was placed on a mounting table (in a waferless state). The cleaning is performed at a pressure equal to that of etching processing, for example, at 20 mTorr.

Subsequently, a switching processing was performed under the conditions represented in Table 4 so as to remove deposits adhered on the surface of a processing container. The switching processing is performed for a longer time than that of the cleaning which is performed for each wafer. Thus, it is possible to remove deposits which were not able to be removed by the cleaning. The switching processing may include a step of a higher processing pressure than that of the cleaning. Accordingly, it is possible to effectively clean the dielectric window and the upper side wall of the processing container. The time for cleaning generally ranges from 1 to 2 min. The time for the switching process may be more than twice the cleaning, preferably about 5 to 10 times.

Subsequently, in order to set the environment within the processing container, after an idle time for, for example, 10 min, seasoning ($O_2$ dry-cleaning, 2 min) was performed. Then, etching of the polysilicon film was performed under the conditions represented in Table 1. Here, cleaning was performed each time when one wafer was etched according to a cleaning recipe so as not to change an etching rate. The cleaning is $SF_6/O_2$ dry-cleaning in which no wafer is placed on a mounting table (in a waferless state).

25 sheets of wafers were used as one lot. In a slot 1 and a slot 25 of a first lot, wafers formed with polysilicon films were disposed, and in slots 2 to 23, dummy wafers made of bare silicon were disposed. Then, the etching rates of the wafers in the slots 1 and 25 were measured.

Between the etching of the first lot and the etching of the second lot, non plasma particle cleaning (NPPC) for removing particles without plasma, and seasoning ($O_2$ dry-cleaning, for 2 min) were performed. In the slot 1 of the second lot, wafers formed with polysilicon films were also disposed, and the etching rate and particles of the slot 1 of the second lot were measured.

Figure 6:
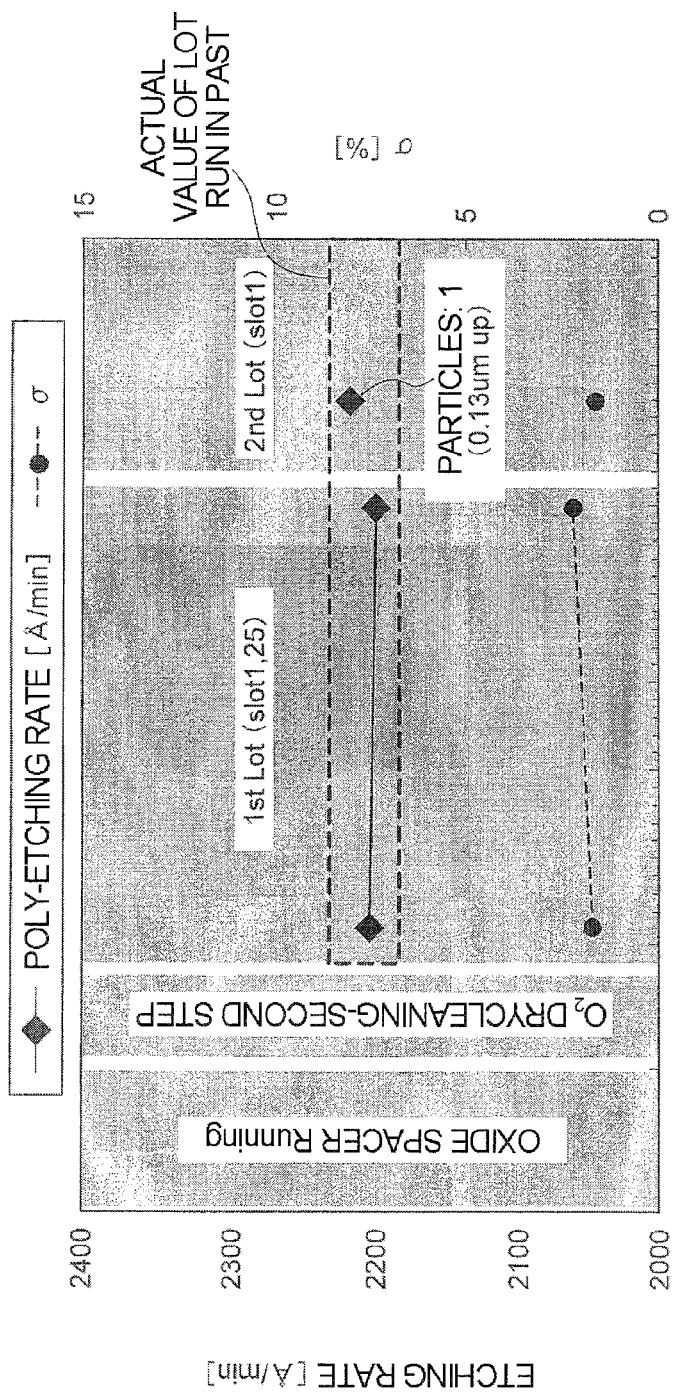
FIG. 6 is a view illustrating a test result of Example 1 in the present disclosure.

FIG. 6 illustrates the measured results of the etching rate of the wafers disposed in the slots 1 and 25 of the first lot, and the wafers disposed in the slot 1 of the second lot. The average value of etching rates in the slot 1 of the first lot was 2202 Å/min, and the average value of etching rates in the slot 25 of the first lot was 2198 Å/min. The average value of etching rates in the slot 1 of the second lot was 2215 Å/min. The difference in the etching rate between 2215 Å/min and an actual value when only etching of a polysilicon film was performed in the past was less than ±0.5%. Further, the number of particles of 0.13 μm or more was 1. The dashed line in FIG. 6 indicates uniformity. It can be found that, through a proper switching processing, it is possible to stabilize the etching rate and to reduce particles as in the case of etching of only the polysilicon film.

Example 2

Switching from Polysilicon Film to Silicon Oxide Film

As described below, etching of a polysilicon film was switched to spacer etching of a silicon oxide film. Then, after the switching, the etching rate of the silicon oxide films and the amount of generated particles were measured.

First, etching of the polysilicon films was performed under the conditions represented in Table 1. Here, cleaning was performed each time when one wafer was etched according to a cleaning recipe so as not to change the etching rate. The cleaning is $SF_6/O_2$ dry-cleaning in which no wafer is placed on the mounting table (in the waferless state). The cleaning is performed at a pressure equal to that of etching processing, for example, at 20 mTorr.

Subsequently, the switching process was performed under the conditions represented in Table 3 so as to remove deposits adhered on the surface of the processing container. The switching processing is performed for a longer time than that of the cleaning which is performed for each wafer. Thus, it is possible to remove deposits which were not able to be removed by the cleaning. The switching processing may include a step of a higher processing pressure than that of the cleaning. Accordingly, it is possible to effectively clean the dielectric window and the upper side wall of the processing container. The time for cleaning generally ranges from 1 to 2 min. The cleaning time for the switching processing may be more than twice the time for cleaning which is performed for each wafer, preferably about 5 to 10 times.

Subsequently, in order to discharge $SF_6$ used for cleaning in the switching process, and to set the environment within the processing container, seasoning ($O_2$ dry-cleaning, 300 mT, 5 min+20 mT, 5 min) was performed. Then, etching of the silicon oxide films was performed under the conditions represented in Table 2. Here, cleaning was performed each time when one wafer was etched according to the cleaning recipe so as not to change the etching rate. The cleaning is $O_2$ dry-cleaning in which no wafer is placed on the mounting table (in the waferless state).

25 sheets of wafers were used as one lot. In the slots 1 to 5, 10, 15, and 25 of a first lot, wafers formed with silicon oxide films were disposed, and in the other slots, dummy wafers formed with silicon oxide films were disposed. Then, the etching rates of the wafers in the slots 1 to 5, 10, 15 and 25 were measured.

Between the etching of the first lot and the etching of the second lot, non plasma particle cleaning (NPPC) for removing particles without plasma, and seasoning ($O_2$ dry-cleaning, 300 mT, 5 min+20 mT, 5 min) were performed. Also, in the slots 1, 15, and 25 of the second lot, wafers formed with silicon oxide films were disposed, and in the other slots, dummy wafers formed with silicon oxide films were disposed. An etching rate and particles of the slot 1 of the second lot were measured. A third lot was etched in the same manner as the second lot.

Figure 7:
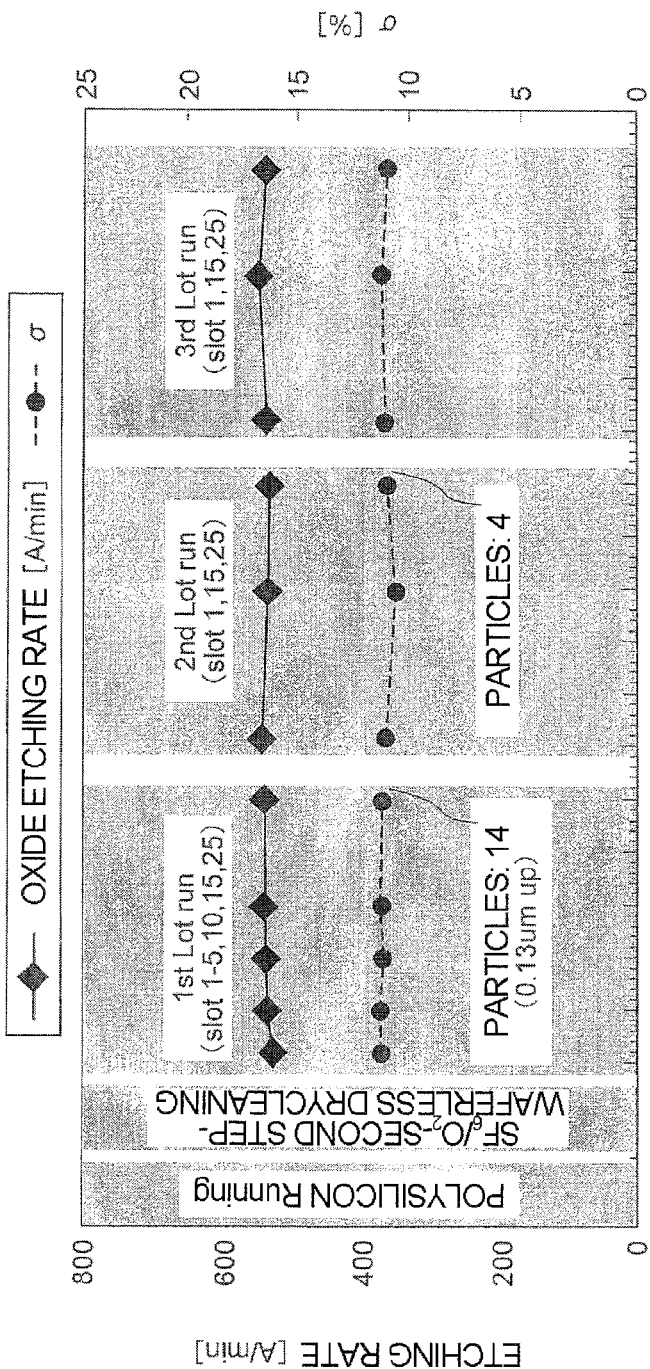
FIG. 7 is a view illustrating a test result of Example 2 in the present disclosure.

FIG. 7 illustrates the measured results. The average value of etching rates of the wafer in the slot 1 of the first lot was 524 Å/min and the average value of etching rates of the wafer in the slot 5 of the first lot was 532 Å/min. The average value of etching rates of the silicon oxide film of the second lot and the third lot was 531 Å/min and the variation rate was ±1.3%. The minimum etching rate was 525 Å/min, and the maximum etching rate was 539 Å/min. At a point of time when the first lot was terminated, the number of particles of 0.13 μm or more was 14, and at a point of time when the second lot was terminated, the number of particles was 4. Through the switching processing, it was possible to stabilize the etching rate in the first lot, equally with the second and third lots. In order to further stabilize the etching rate, in the processing, from the first to fourth wafers in the first lot, dummy wafers may be processed, and from the fifth wafer, actual wafers may be processed. The number of particles acceptable in a general etching processing state is less than 40.

Example 3

Switching when Etching Multi-Layered Film on Wafer

In Example 3, during transition from a process of etching a silicon oxide film on a wafer (a second etching process) using a wafer formed with a multi-layered film that includes a silicon oxide film and a polysilicon film to a process of etching a polysilicon film on a wafer (a first etching process), a switching process (a second switching process) is performed. In the switching process, a cleaning gas containing oxygen is introduced into a processing container in a state where the wafer is placed on a mounting table, and the cleaning gas is turned into plasma to remove reaction products deposited on the wafer and within the processing container, such as C or CF. The reaction products such as C or CF are generated due to the process of etching the silicon oxide film on the wafer (the second etching process).

In addition, in Example 3, during transition from the process of etching a polysilicon film on a wafer (the first etching process) to the process of etching a silicon oxide film on a wafer (the second etching process), the switching process (the first switching process) is performed. In the switching process, a cleaning gas containing fluorine is introduced into the processing container in a state where the wafer is placed on the mounting table, and the cleaning gas is turned into plasma to remove reaction products deposited on the wafer and within the processing container, such as SiBrO or SiClO. The reaction products such as SiBrO, or SiClO are generated due to the first etching process.

FIGS. 8A to 8G illustrate process diagrams of a method for forming a double pattern in which first and second etching processes, and first and second switching processes are performed. The first and second etching processes, and the first and second switching processes are performed within an RISA etching device.

Figure 8A:
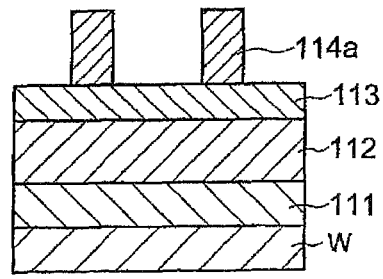
FIGS. 8A to 8G illustrate process diagrams of double patterning of Example 3 in the present disclosure.

As illustrated in FIG. 8A, a silicon nitride film 111, a polysilicon film 112 and an anti-reflection layer (BARC) 113 are sequentially laminated on a wafer W made of, for example, silicon. The silicon nitride film 111 and the polysilicon film 112 are formed by, for example, chemical vapor deposition (CVD). On the surface of the anti-reflection layer 113, a photoresist made of ArF is coated. On the photoresist, a mask pattern is transferred through exposure, and a latent image is formed. The exposed photoresist is subjected to a development process. After the development, on the surface of the anti-reflection layer 113, a resist pattern 114a is formed. The resist pattern 114a is formed in, for example, a line/space pattern. The resist pattern 114a is formed such that the ratio of line width to inter-line interval equals to 1:3. The anti-reflection layer 113 is etched using the resist pattern 114a as a mask.

Figure 8B:
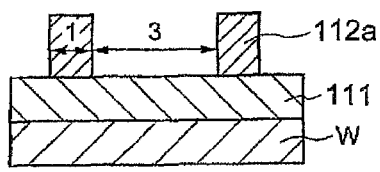

Subsequently, as illustrated in FIG. 8B, the polysilicon film 112 is etched using the resist pattern 114a as a mask so that the polysilicon film 112 is formed in the same pattern as that of the resist pattern 114a, for example, a line/space pattern 112a. The line/space pattern 112a is formed such that the ratio of line width to inter-line interval equals to 1:3.

Figure 8C:
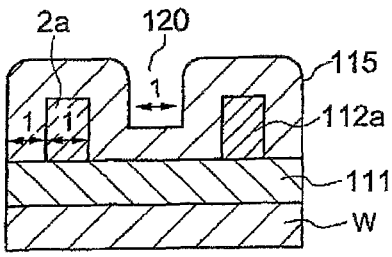

Subsequently, as illustrated in FIG. 8C, on the line/space pattern 112a, a silicon oxide film 115 of which the film thickness is conformal (uniform) is formed. The silicon oxide film 115 is formed by, for example, a chemical vapor deposition (CVD) using a TEOS gas as a raw material gas.

The silicon oxide film 115 is formed on the top surface of the line/space pattern 112a, that is, on the top surfaces of the lines 112a, on the side walls at the left and right sides of the lines 112a, and on the top surface of the silicon nitride film 111 between the lines 112a. The thickness of the silicon oxide film 115 formed on the side walls of the lines 112a corresponds to the width of each of the lines 112a. Since the interval between the adjacent lines 112a is three times the width of each of the lines 112a, a space 120 with the same width as that of each of the lines 112a is vacant between the silicon oxide films 115 formed on the side walls of the adjacent lines 112a. Instead of the silicon oxide film 115, an insulating film such as a silicon nitride film may be used.

Figure 8D:
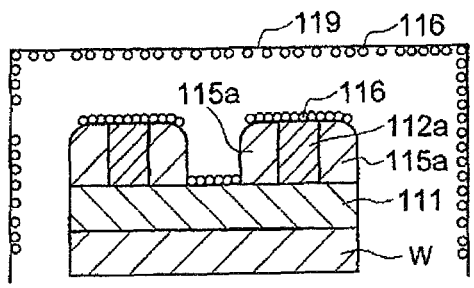

Subsequently, as illustrated in FIG. 8D, in order to form spacers 115a including the silicon oxide film 115 on the side walls of the lines 112a, the silicon oxide film 115 formed on the top surfaces of the lines 112a and on the top surface of the silicon nitride film 111 between the lines 112a is etched.

For example, Ar as a plasma excitation gas, $CHF_3$ gas as an etching gas, and $O_2$ gas for strengthening the spacers 115a are introduced into the processing container of the RLSA etching device. These gases are turned into plasma so as to etch the silicon oxide film 115. When the etching is completed, on the surface of the processing container 119, deposits 116 derived from a CF-based gas are deposited.

Figure 8E:
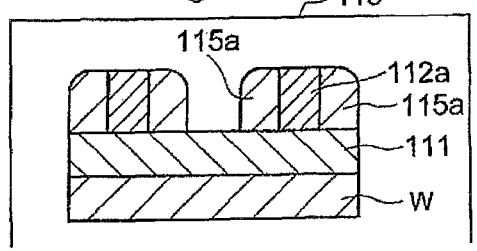
Figure 8F:
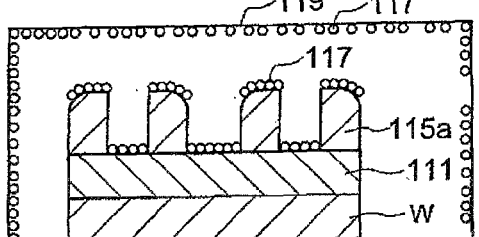

In FIGS. 8A to 8G, the processing container 119 is illustrated only in FIGS. 8D to 8F, and is omitted in FIGS. 8A to 8C.

Subsequently, a switching processing is performed under the conditions as represented in Table 5. By this switching processing, the deposits 116 adhered on the surface of the processing container 119 are removed. $O_2$ gas as a cleaning gas, and Ar as a plasma excitation gas are introduced into the processing container. The $O_2$ gas may be mixed with CO and/or $CO_2$. The Ar gas is introduced into the processing container to ignite plasma. After ignition, only the $O_2$ gas as the cleaning gas may be introduced into the processing container, or a mixed gas of $O_2$ with Ar gas may be introduced into the processing container. When the $O_2$ gas is turned into plasma, the plasma of $O_2$ removes the deposits 116 deposited on the surface of the processing container 119, such as C or CF, by oxidizing the deposits 116 into, for example, CO.

The switching processing focuses on the removal of the deposits 116 deposited on the surface of the processing container 119, but may remove the deposits 116 adhered on the surface of the wafer W, that is, on the surfaces of the silicon nitride film 111 and the lines 112a under the conditions as represented in Table 5. FIG. 8E illustrates a state where the deposits 116 are removed by the switching process.

TABLE 5

| Processing Gas | $O_2$: 350 sccm |
|---|---|
| Pressure | 100 mT or more, 300 mT or less |
| Microwave Power | 2000 W |
| RF Bias | 0 W |
| Substrate Temperature | 20° C. or more, 30° C. or less |
| Processing Time | 5 sec |

As represented in Table 5, the switching process is performed in a non-bias state where a bias power is not applied to the mounting table of the processing container, at a high pressure within the processing container in a range from 100 mT to 300 mT. By substantially applying no RF bias to the substrate, the substrate may not be processed. An RF bias power in a range which does not substantially affect the substrate may be applied.

Subsequently, as illustrated in FIG. 8F, only the lines 112a made of polysilicon are etched to be removed. Since the deposits 116 on the lines 112a have been removed, the lines 112a may be etched. For example, Ar as a plasma excitation gas, HBr and/or $Cl_2$ as an etching gas, and $O_2$ and/or CO gas for controlling the shape of the spacers 115a are introduced into the processing container. These gases are turned into plasma to etch the lines 112a made of polysilicon. When the lines 112a are etched, the spacers 115a are formed by twice the number of the resist patterns 114a.

When the lines 112a made of polysilicon are etched using the etching gas containing a halogen element, deposits 117 such as SiBrO or SiClO, which are reaction products of the etching gas and the polysilicon film are deposited on the surface of the processing container 119.

Subsequently, a switching process for removing the deposits 117 is performed. For example, Ar as a plasma excitation gas, and $SF_6$ or $O_2$ as a cleaning gas are introduced into the processing container. The cleaning gas is turned into plasma, and the deposits 117 deposited on the surface of the processing container 119 are removed.

The switching process focuses on the removal of the deposits 117 deposited on the surface of the processing container 119, but may remove the deposits 117 adhered on the surface of the wafer W, that is, on the surfaces of the spacers 115a and the silicon nitride film 111 under predetermined conditions.

Figure 8G:
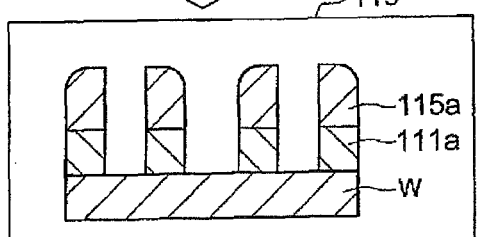

Subsequently, as illustrated in FIG. 8G, when the silicon nitride film 111 is etched by using the spacers 115a of the silicon oxide film 115 as a mask, mask patterns 111a of the silicon nitride film 111 are formed. Since the deposits 117 on the silicon nitride film 111 have been removed, the silicon nitride film 111 may be etched. In the etching of the silicon nitride film 111, Ar as a plasma excitation gas, and $CHF_3$ gas as an etching gas, are introduced into the processing container. These gases are turned into plasma to etch the silicon nitride film 111. Through the above described process, a double-pattern is formed on the wafer W.

Hereinafter, descriptions will be made on the reasons of specifying the conditions for the switching process in which the cleaning gas containing $O_2$ gas is turned into plasma are specified as represented in Table 5.

FIGS. 9A to 9D illustrate test results on etching rates of KrF photoresists under different pressures. In this test, the switching process (hereinafter, referred to as $O_2$ flush) was performed by supplying a microwave power of 3000 W to the KrF photoresists for 10 sec under each pressure. Since the KrF photoresists may be assumed to be as a deposit which contains carbon, it is possible to find out the relationship between the conditions for $O_2$ flush and the etching rates. In FIGS. 9A to 9D, the unit of the horizontal axis is mm, and the unit of the vertical axis is Å/min. 0 on the horizontal axis represents the center of a substrate W. Etching rates in X-axis, Y-axis, V-axis, and W-axis on the substrate W are represented. According to FIG. 9A, when the pressure is 20 mT, the etching rate is maintained at a high value (114.0 nm for 10 sec). When the etching rate is high, a recess (dent) may occur on a base. Thus, it is necessary to reduce the etching rate.

According to FIG. 9B, when the pressure is 60 mT, the etching rate is still maintained at a high value (87.7 nm for 10 sec). When the pressure is 60 mT, the etching rate of the KrF photoresist still has a high value. Thus, in order to further reduce the etching rate, it is necessary to perform $O_2$ flush at a pressure higher than 60 mT.

According to FIG. 9C, when the pressure is 100 mT, the etching rate has a low value (39.7 nm for 10 sec). In order to make the etching rate lower than 39.7 nm/10 sec, the $O_2$ flush may be performed at 100 mT or more. According to FIG. 9D, when the pressure is 200 mT, the etching rate has a lower value (20.5 nm for 10 sec). The $O_2$ flush may be performed at 200 mT because the etching rate may be lower than that used when the pressure is 100 mT.

Figure 10A:
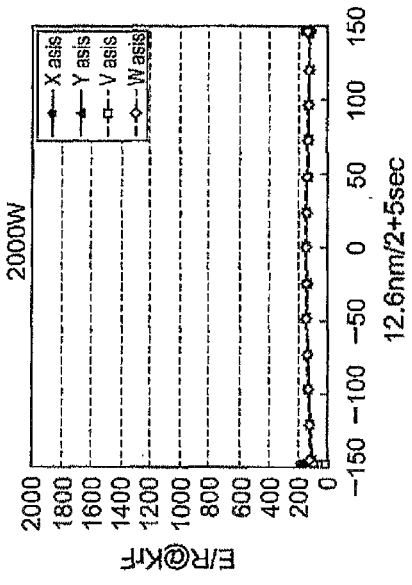
FIGS. 10A to 10C illustrate graphs of test results on an etching rate of a KrF photoresist under different microwave powers.
Figure 10B:
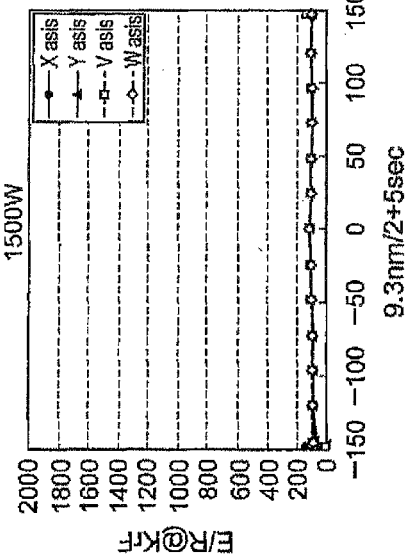
Figure 10C:
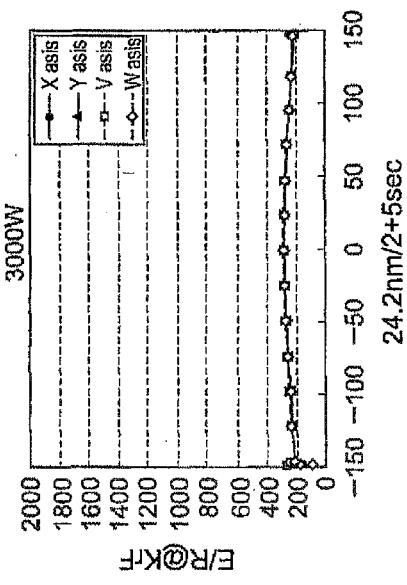

FIGS. 10A to 10C illustrate test results on etching rates of KrF photoresists when the microwave power was varied. The $O_2$ flush was performed by supplying a microwave power of each of 1500 W, 2000 W, and 3000 W to the KrF photoresists for 5 sec under a pressure of 100 mT.

According to FIG. 10A, when the microwave power is 1500 W, the etching rate has a low value (9.3 nm for 2 sec). According to FIG. 10B, when the microwave power is 2000 W, the etching rate is slightly increased but is maintained to be still a low value (12.6 nm for 2 sec). According to FIG. 10C, when the microwave power is 3000 W, the etching rate has an increased value (24.2 nm for 2 sec) which is twice the value at 2000 W. In order to reduce the etching rate, the microwave power may be set to 2000 W. When the microwave power is 1500 W, the etching rate may be further reduced. Thus, the microwave power may be set to 1500 W.

Further, the present disclosure may be modified or changed in various ways in consideration of the above description. It is possible to make various modifications or changes in specific exemplary embodiments without departing from the scope of the present disclosure.

In the present exemplary embodiment, it has been described that an idle time and seasoning are provided for measurement, but the idle time and seasoning are not necessary in an actual processing. In the actual processing, the idle time and the seasoning may be provided in order to reduce the influence of a cleaning gas used for a switching processing.

In the present exemplary embodiment, it has been described that dry-cleaning in a waferless state is performed, but the present disclosure is not limited thereto. Dry-cleaning using a dummy wafer may be performed. In this case, the time for conveying the dummy wafer is required, but damage to a mounting table 12 may be inhibited.

In the present exemplary embodiment, it has been described that cleaning is performed each time when one wafer is etched, but the present disclosure is not limited thereto. For example, the cleaning may be performed once each time when five wafers are etched. Otherwise, the cleaning may not be performed.

In the present exemplary embodiment, it has been described that each of a polysilicon film etching processing and an oxide film etching processing is performed, but the present disclosure is not limited thereto. The present disclosure may be employed in a process of performing the oxide film etching processing after the polysilicon film etching processing, or a process of performing the polysilicon film etching processing after the oxide film etching processing.

In the present exemplary embodiment, wet maintenance or running of a plurality of sheets of dummy wafers for a long time is not performed, and, thus, the time required for the wet maintenance or the dummy substrates required for running may be reduced.

For example, as an insulating film, a silicon nitride film may be etched instead of a silicon oxide film.

This application is based on and claims priority from Japanese Patent Application No. 2011-155171 filed on Jul. 13, 2011, the disclosure of which is incorporated herein in its entirety by reference.

| Description of Symbols | |
|---|---|
| 2: polysilicon film (silicon-containing film) | 2a: gate electrode |
| 5: silicon oxide film (insulating film) | 5a: spacer |
| 10: processing container | 54: slot antenna plate |
| 7, 8: load-lock module | 6: vacuum conveyance module |
| PM1 to PM4: process module | W: wafer (substrate) |
| S1: first etching process | S2: first switching process |
| S3: second etching process | S4: second switching process |

What is claimed is:

1. An etching method comprising:
   a first etching process of etching a film on a first substrate by introducing a first processing gas into a processing container, and turning the first processing gas into plasma; and
   a second etching process of etching a film, of which the type is different from that of the film on the first substrate, on a second substrate by introducing a second processing gas, of which the type is different from that of the first processing gas, into the processing container, and turning the second processing gas into plasma,
   wherein the first etching process and the second etching process are performed within the same processing container in a switching manner,
   during transition from the first etching process to the second etching process, a first switching process is performed to introduce a cleaning gas into the processing container and turn the cleaning gas into plasma so as to remove reaction products deposited within the processing container in the first etching process,
   during transition from the second etching process to the first etching process, a second switching process is performed to introduce a cleaning gas into the processing container and turn the cleaning gas into plasma so as to remove reaction products deposited within the processing container in the second etching process, and
   in each of the first switching process and the second switching process, at least two sub-processing steps each set with a different pressure from each other are sequentially performed while turning the cleaning gas into the plasma.

2. The etching method of claim 1, wherein, in the first etching process, the first processing gas containing a halogen element is introduced into the processing container and turned into the plasma so as to etch a silicon-containing film formed on a substrate, and
   in the second etching process, the second processing gas containing carbon and fluorine is introduced into the processing container and turned into the plasma so as to etch an insulating film formed on the substrate.

3. The etching method of claim 1, wherein, in the first switching process, the cleaning gas containing fluorine is introduced into the processing container.

4. The etching method of claim 1, wherein, in the second switching process, the cleaning gas containing oxygen is introduced into the processing container.

5. The etching method of claim 1, further comprising a first cleaning process for the first etching process, and/or a second cleaning process for the second etching process,
   wherein the first switching process and/or the second switching process includes a processing performed at a higher pressure than that in the first cleaning process, and/or that in the second cleaning process.

6. The etching method of claim 1, wherein, in the first etching process, the second etching process, the first switching process and the second switching process, microwaves are introduced into the processing container using a radial line slot antenna (RLSA) in order to excite the plasma.

7. The etching method of claim 1, wherein the first etching process is etching for forming a gate electrode on a substrate, and
   the second etching process is etching for forming a spacer on a side wall of the gate electrode on the substrate.

8. The etching method of claim 1, wherein, in the first etching process, the first processing gas containing a halogen element is introduced into the processing container and turned into the plasma so as to etch a silicon-containing film formed on the substrate,
   in the second etching process, the second processing gas containing carbon and fluorine is introduced into the processing container and turned into the plasma so as to etch an insulating film formed on the substrate, and
   during transition from the second etching process to the first etching process, in the second switching process, the cleaning gas containing oxygen is introduced into the processing container and turned into the plasma so as to remove the reaction products deposited on the substrate and within the processing container in the second etching process.

9. The etching method of claim 1, wherein, in the first switching process, the two sub-processing steps include sequentially performing a relatively lower pressure processing step of turning the cleaning gas into the plasma while the inside of the processing container is set to a relatively lower pressure, and a relatively higher pressure processing step of turning the cleaning gas into the plasma while an inside of the processing container is set to a relatively higher pressure, and in the second switching process, the two sub-processing steps include sequentially performing a relatively higher pressure processing step and a relatively lower pressure processing step.

10. The etching method of claim 9, wherein the relatively lower pressure is 10 mT or more and less than 100 mT, and the relatively higher pressure is 100 mT or more and less than 300 mT in each of the first and second switching processes.

11. An etching device comprising a control unit, wherein the control unit causes a first etching and a second etching to be performed within a same processing container in a switching manner to introduce a first processing gas into the processing container and turn the first processing gas into plasma so as to etch a film on a substrate in the first etching, and to introduce a second processing gas, of which the type is different from that of the first processing gas, into the processing container and turn the second processing gas into plasma so as to etch a film, of which the type is different from that of the film on the substrate in the second etching, during transition from the first etching to the second etching, a first switching process is performed in which a cleaning gas is introduced into the processing container and turned into plasma so as to remove reaction products deposited within the processing container in the first etching, during transition from the second etching to the first etching, a second switching process is performed in which a cleaning gas is introduced into the processing container and turned into plasma so as to remove reaction products deposited within the processing container in the second etching, and in each of the first switching process and the second switching process, at least two sub-processing steps each set with a different pressure from each other are sequentially performed while turning the cleaning gas into the plasma.

* * * * *